(12) United States Patent
Seddon

(10) Patent No.: US 10,589,989 B2
(45) Date of Patent: Mar. 17, 2020

(54) ABSOLUTE AND DIFFERENTIAL PRESSURE SENSORS AND RELATED METHODS

(71) Applicant: SEMICONDUCTOR COMPONENTS INDUSTRIES, LLC, Phoenix, AZ (US)

(72) Inventor: Michael J. Seddon, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 72 days.

(21) Appl. No.: 15/782,758

(22) Filed: Oct. 12, 2017

(65) Prior Publication Data

US 2018/0105417 A1 Apr. 19, 2018

Related U.S. Application Data

(60) Provisional application No. 62/408,519, filed on Oct. 14, 2016.

(51) Int. Cl.
| | | |
|---|---|---|
| *B81B 7/00* | (2006.01) | |
| *B81B 3/00* | (2006.01) | |
| *G01L 9/00* | (2006.01) | |
| *G01L 13/02* | (2006.01) | |
| *G01L 9/06* | (2006.01) | |

(52) U.S. Cl.
CPC ............ *B81B 7/008* (2013.01); *B81B 3/0021* (2013.01); *G01L 9/0048* (2013.01); *G01L 9/0054* (2013.01); *G01L 9/0055* (2013.01); *G01L 13/025* (2013.01); *B81B 2201/0264* (2013.01); *B81B 2203/0127* (2013.01); *G01L 9/06* (2013.01)

(58) Field of Classification Search
CPC ...... G01L 9/0048; G01L 9/0054; B81B 7/008
See application file for complete search history.

(56) References Cited

U.S. PATENT DOCUMENTS

2012/0266684 A1* 10/2012 Hooper ................. G01L 9/0052
73/721

* cited by examiner

*Primary Examiner* — Jamel E Williams
(74) *Attorney, Agent, or Firm* — Adam R. Stephenson, Ltd.

(57) ABSTRACT

Implementations of absolute pressure sensor devices may include a microelectromechanical system (MEMS) absolute pressure sensor coupled over a controller die. The MEMS absolute pressure sensor may be mechanically coupled to the controller die and may also be configured to electrically couple with the controller die. A perimeter of the controller die may be one of the same size and larger than a perimeter of the MEMS absolute pressure sensor. The controller die may be configured to electrically couple with a module through an electrical connector.

13 Claims, 12 Drawing Sheets

ABSOLUTE AND DIFFERENTIAL PRESSURE SENSORS AND RELATED METHODS

CROSS REFERENCE TO RELATED APPLICATIONS

This document claims the benefit of the filing date of U.S. Provisional Patent Application Ser. No. 62/408,519, entitled "Absolute and Differential Pressure Sensors and Related Methods" to Michael J. Seddon which was filed on Oct. 14, 2016, the disclosure of which is hereby incorporated entirely herein by reference.

BACKGROUND

1. Technical Field

Aspects of this document relate generally to pressure sensors including microelectromechanical system (MEMS) pressure sensors, such as absolute and differential pressure sensors. More specific implementations involve stacked die pressure sensors.

2. Background

Conventionally, pressure sensors are used in many industries, such as the automotive industry, to measure pressures of both gases and liquid fluids, including harsh fluids such as oils. Pressure sensors may be absolute, meaning they measure pressure relative to a vacuum, or differential, meaning they measure the pressure difference between two gases or fluids. MEMS sensors have been incorporated into absolute and differential pressure sensors. Specifically, the MEMS pressure sensors include a diaphragm that detects pressure applied against a single side (absolute pressure sensor) or from both sides (differential pressure sensor). As pressure is experienced by the diaphragm, the diaphragm bends and produces an elastic strain. The elastic strain is detected by a change in a property of a component of the MEMS device, such as a piezoresistor, within the MEMS which allows for a pressure to be measured and calculated.

SUMMARY

Implementations of absolute pressure sensor devices may include a microelectromechanical system (MEMS) absolute pressure sensor coupled over a controller die. The MEMS absolute pressure sensor may be mechanically coupled to the controller die and may also be configured to electrically couple with the controller die. A perimeter of the controller die may be one of the same size and larger than a perimeter of the MEMS absolute pressure sensor. The controller die may be configured to electrically couple with a module through an electrical connector.

Implementations of absolute pressure sensor devices may include one, all, or any of the following:

The electrical connector may be one of a wirebond, stud, bump, and through-silicon-via.

The MEMS absolute pressure sensor may be coupled to the controller die through a flip-chip coupling.

The MEMS absolute pressure sensor may be electrically coupled with the controller die through a wirebond.

The absolute pressure sensor device may also include an encapsulant at least partially encapsulating the MEMS absolute pressure sensor and the controller die.

The controller die may be configured to couple to a module through a flip-chip coupling.

The MEMS absolute pressure sensor may be configured to couple with the module through a wirebond.

Implementations of differential pressure sensor devices may include a microelectromechanical system (MEMS) differential pressure sensor coupled over an interposer, wherein the interposer comprises an opening therethrough providing fluid access to the MEMS differential pressure sensor, and a controller die coupled over the interposer. The MEMS differential pressure sensor may be configured to electrically couple with the controller die and the controller die may be configured to electrically couple with a module.

Implementations of differential pressure sensor devices may include one, all, or any of the following:

The controller die may be configured to couple with a module through one of a wirebond, a stud, a bump, and a through-silicon-via.

The MEMS differential pressure sensor may be electrically coupled with the controller die through a wirebond.

The MEMS differential pressure sensor may be coupled to the interposer through a flip-chip coupling, wherein an encapsulant may at least partially encapsulate a plurality of flip-chip bumps and may provide a substantially fluid-tight seal between the MEMS differential pressure sensor and the interposer.

The controller die may be coupled to the interposer through a flip-chip coupling.

The differential pressure sensor device may also include an encapsulant at least partially encapsulating the MEMS differential pressure sensor and the controller die.

The opening of the interposer may be configured to align with an opening in the module.

Implementations of differential pressure sensor devices may include a microelectromechanical system (MEMS) differential pressure sensor coupled over a controller die, wherein the controller die may include an opening therethrough providing fluid access to the MEMS differential pressure sensor. The MEMS differential pressure sensor may be configured to electrically couple with the controller die and the controller die may be configured to electrically couple with a module through an electrical contact.

Implementations of differential pressure sensor devices may include one, all, or any of the following:

A perimeter of the controller die may be not coextensive with a perimeter of the MEMS differential pressure sensor.

The MEMS differential pressure sensor may be coupled to the controller die through a flip-chip coupling, wherein an encapsulant may at least partially encapsulate a plurality of flip-chip bumps and may provide a substantially fluid-tight seal between the MEMS differential pressure sensor and the controller die.

The MEMS differential pressure sensor may be wire bonded to the controller die.

The differential pressure sensor device may also include an encapsulant at least partially encapsulating the MEMS differential pressure sensor and the controller die.

The controller die may include one or more through-silicon-vias configured to electrically couple a controller die with a module.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended pressure sensor devices will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such pressure sensor devices, and implementing components and methods, consistent with the intended operation and methods.

Figure 1:
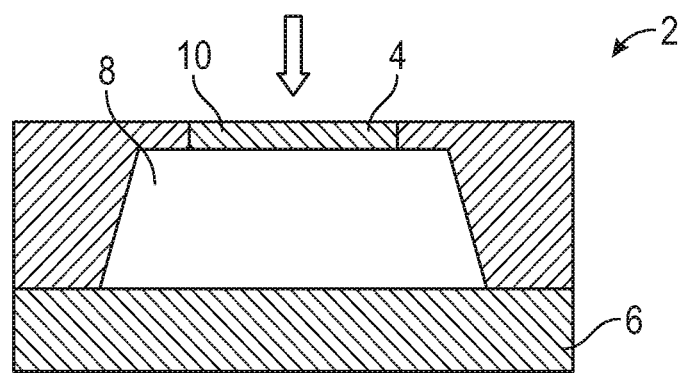
FIG. 1 is a cross sectional side view of an absolute pressure sensor.

Referring to FIG. 1, a cross sectional side view of an absolute pressure sensor is illustrated. The pressure sensor 2 of FIG. 1 is a representative example of an absolute pressure sensor. In various implementations, as illustrated in FIG. 1, a microelectromechanical system (MEMS) sensor 4 may be coupled with a carrier 6. The carrier may be, by non-limiting example, glass, silicon, metal, or rigid material or combination of any of the foregoing materials. A sealed cavity 8 is formed between the MEMS sensor 4 and the carrier 6. The pressure within the cavity 8 forms the fixed reference pressure of the absolute pressure sensor 2. In various implementations, the MEMS sensor 4 may include a diaphragm 10. The diaphragm may be made of an elastic material. As a pressure external to the absolute pressure sensor 2 varies from the reference pressure within cavity 8, the diaphragm 10 may be elastically stretched out (where the external pressure is less than the reference pressure) or curve into the cavity (where the external pressure is more than the reference pressure). As the diaphragm 10 moves into an equilibrium position with the external pressure, the MEMs sensor is able to measure an external pressure relative to the internal fixed reference pressure. In various implementations, the absolute pressure sensor may measure pressures between about 0.5-7 bars. In other implementations, the absolute pressure sensor may measure pressures less than about 0.5 bar or more than about 7 bars. In various implementations, the MEMS pressure sensor may include a piezoresistor. In such implementations, as the diaphragm 10 is under elastic strain, the resistive properties of the piezoresistor change. The external pressure may be calculated from the correlating the change of resistive value in the piezoresistor with known external pressures. In various implementations, a bridge circuit, such as a bridge circuit marketed under the tradename WHEATSTONE® by Wheatstone Corporation of New Bern, N.C., may be created over and used with the piezoresistive MEMS sensor. In other implementations, other MEMS pressure sensors using a structure other than a piezoresistor may be used within the absolute pressure sensor. As used herein, the absolute pressure sensor 2, including the MEMS pressure sensor and the remainder of the pressure sensor package, is collectively referred to as a MEMS absolute pressure sensor.

Figures 2A, 2B:
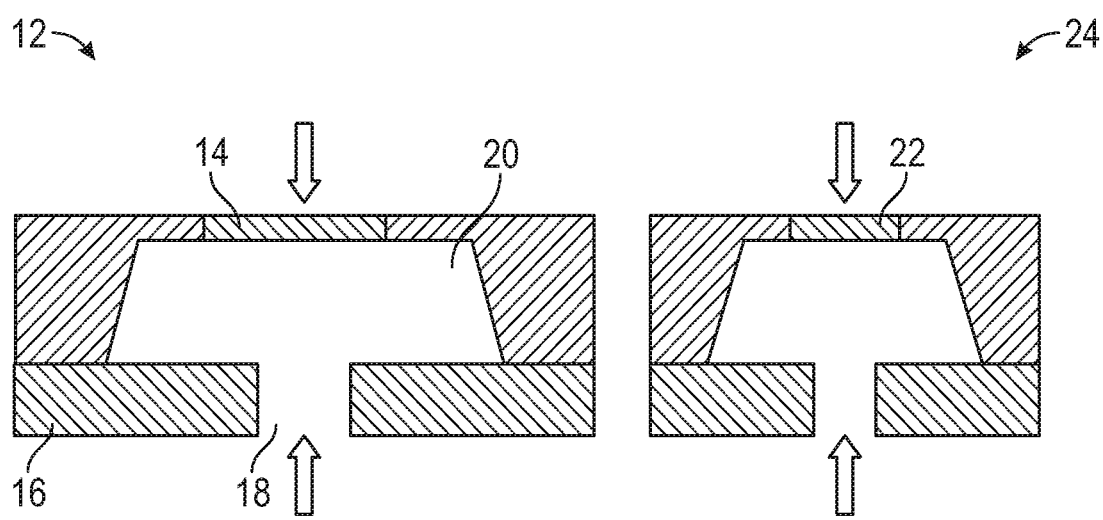
FIG. 2A is a cross sectional side view of a first differential pressure sensor.
FIG. 2B is a cross sectional side view of a second differential pressure sensor.

Referring to FIG. 2A, a cross sectional side view of a first differential pressure sensor is illustrated. The differential pressure sensor 12 of FIG. 2A is just a representative example of a differential pressure sensor. In various implementations, the differential pressure sensor 12 may include a MEMS pressure sensor 14. The MEMS sensor may be any type of sensor previously disclosed herein, including a pressure sensor utilizing a piezoresistor. In various implementations, the MEMS sensor 14 may be coupled with a carrier 16. The carrier 16 may be similar to the carrier of FIG. 1, with the difference being that the carrier includes an opening 18 therethrough. Rather than having a fixed reference pressure within a sealed cavity, as illustrated in FIG. 1, the differential pressure sensor has an open cavity 20 and is able to measure a pressure above the pressure sensor as it differs from a pressure below the pressure sensor, and vice versa. In various implementations, the differential pressure sensor 12 may be able to measure pressures as low as about 0.1 bar. In other implementations, the differential pressure sensor may be able to measure pressures lower than about 0.1 bar or greater than about 0.1 bar. Referring to FIG. 2B, a cross sectional side view of a second differential pressure sensor implementation is illustrated. As illustrated in FIG. 2B, parameters and dimensions of the differential pressure sensor, such as the width of the diaphragm 22, may be altered to adjust the range of pressures that the pressure sensor is capable of measuring. In various implementations, the differential pressure sensor 24 may be capable of measuring between about 0.5-7 bar, and in other implementations, the differential pressure sensor 24 may be capable of measuring pressures greater than about 7 bar or less than about 0.5 bar. As used herein, the differential pressure sensor 12 or 24, including the MEMS pressure sensor and the remainder of the pressure sensor package, is collectively referred to as a MEMS absolute pressure sensor.

Figure 3:
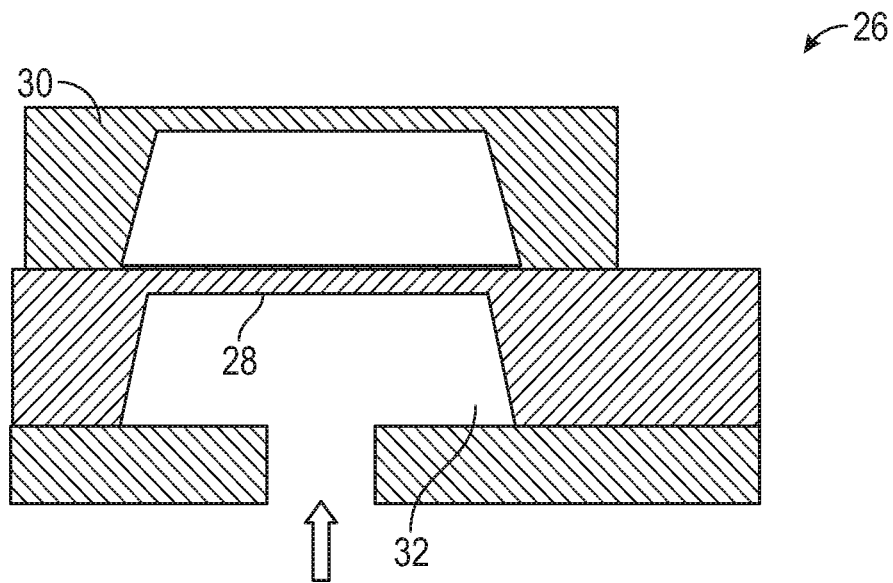
FIG. 3 is a cross sectional side view of a transmission pressure sensor.

Referring to FIG. 3, a cross sectional side view of a transmission pressure sensor is illustrated. In this representative example, the transmission pressure sensor 26 is an absolute pressure sensor but differs from the pressure sensor of FIG. 1 in that the pressure medium is applied from the backside 28 of the pressure sensor instead of the topside 30. One feature of such a pressure sensor is that the pressure medium (fluid applying the pressure) does not contact electrical contacts of the device which may be on the topside 30. In various implementations, transmission pressure sensors like those illustrated in FIG. 3 may be capable of measuring pressures between about 7-30 bar. In other implementations, the transmission pressure sensor may be capable of measuring pressures less than about 7 bar or greater than about 30 bar. Transmission pressure sensors may be used to measure pressures of non-gas mediums, such as liquids, and also of harsh mediums such as oil and the like (these mediums flow into the bottom portion 32 of the sensor). In various implementations, the transmission pressure sensor may be used in automotive vehicles to measure the amount of hydraulic pressure within a transmission. In other implementations, the transmission pressure sensor may be a differential pressure sensor and may allow for measurement of a pressure difference between a gas or liquid above the top sensor and a gas or liquid flowing into the bottom sensor 32.

Figure 4:
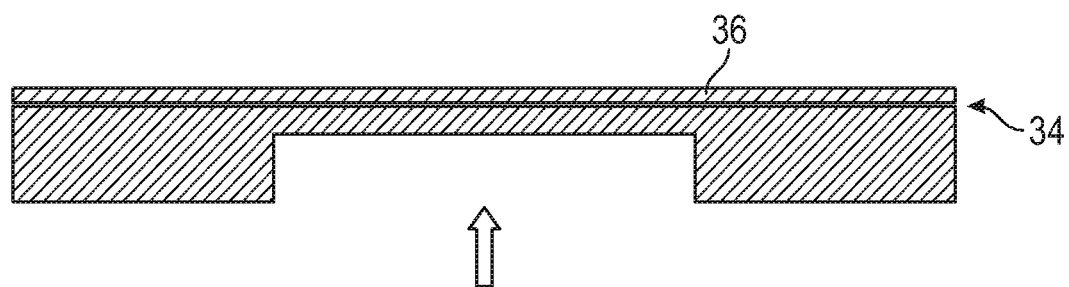
FIG. 4 is cross sectional side view of a high pressure sensor.

Referring to FIG. 4, a cross sectional side view of a high pressure sensor is illustrated. As illustrated, the pressure sensor 34 is a representative example of a pressure sensor having barometric pressure on the top side 36. As can be seen in FIG. 4, the high pressure sensor has a relatively small cavity therein compared with the other pressure sensors disclosed herein. The high pressure sensor may be capable of measuring higher pressures because a thicker layer can be used below the MEMS or other pressure sensor, with the smaller cavity permitting the use of the thicker layer. The thickness of the layer and the size of the cavity can be designed according to the pressure to be measured. In this application, high pressure sensors may measure pressures greater than 30 bar. They may be absolute, differential, or transmission pressure sensors like any disclosed herein with a thicker layer and smaller cavity like that illustrated in FIG. 4.

Any of the pressure sensors types illustrated in FIGS. 1-4 may be incorporated into a semiconductor device for an end use. One non-limiting example of an end use is a pressure sensor for use in the automotive industry. A pressure sensor for use in a vehicle brake boost application is one representative example, but the pressure sensors disclosed herein may be used in any other applications and/or industries.

The pressure sensor devices may be fabricated on a semiconductor wafer and much of the processing described herein may be done at the wafer level, including sensor calibration and electrical tests as will be described hereafter. An 8 inch wafer is one representative example of a wafer size that may be used, though other wafer sizes may be used. Below is a table showing x, y and z dimensions of conventional pressure sensors, such as those illustrated in FIGS. 1-2B and 4.

| Pressure Sensor | X(mm) (Width) | Y(mm) (Length) | Z(mm) (Height) |
|---|---|---|---|
| Absolute, FIG. 1 | 1-2 | 1-2 | 1-1.5 |
| Differential, FIG. 2A | 2-3 | 2-3 | 1-1.5 |
| Differential, FIG. 2B | 2-3 | 2-3 | 1-1.5 |
| High Pressure, FIG. 4 | 0.5-1 | 0.5-1 | 1-1.5 |

Conventionally, pressure sensor devices include both a pressure sensor and a controller die with the pressure sensor wire bonded next to the controller die. In various implementations, the size of a conventional controller die is substantially 2 mm×2 mm to 4 mm×4 mm, or 4-16 mm². A pressure sensor device that includes such a die coupled next to a pressure sensor consumes a significant amount of space.

Figure 5:
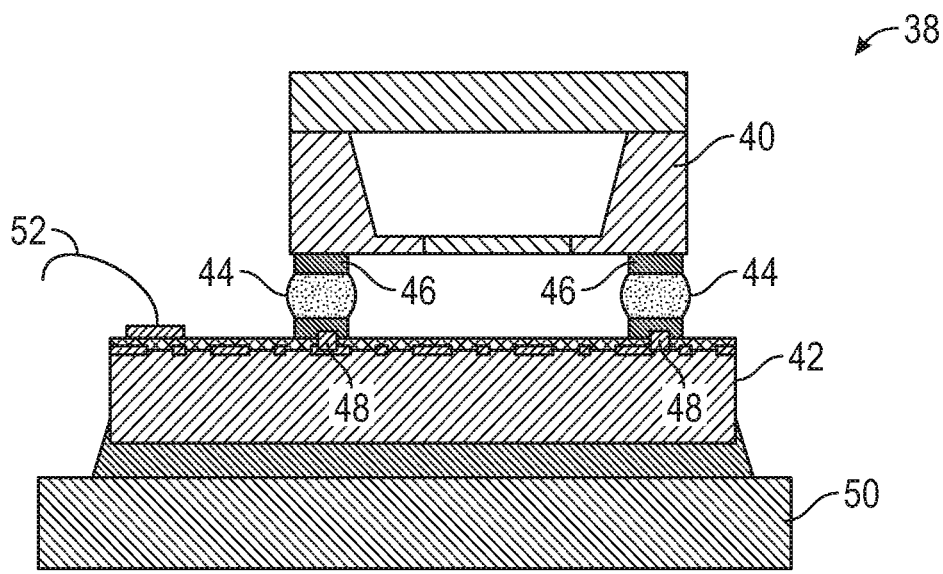
FIG. 5 is a cross sectional side view of a flip chip MEMS absolute pressure sensor coupled over a die.
Figure 6:
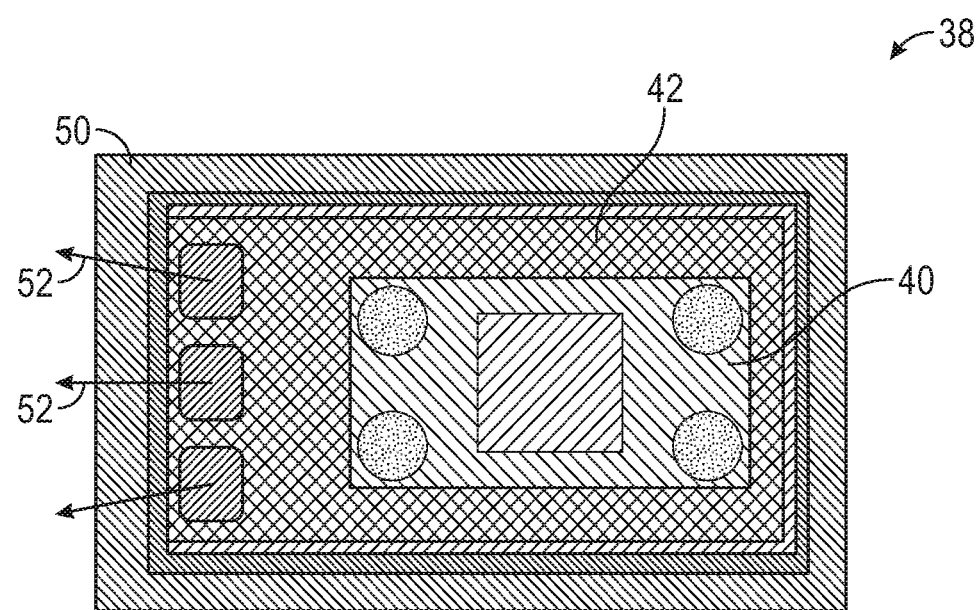
FIG. 6 is a top view of the device of FIG. 5.

Referring now to FIGS. 5 and 6, a cross sectional side view and a top view of a flip chip absolute pressure sensor coupled over a die is illustrated. In various implementations, an absolute pressure sensor device 38 may include a MEMS absolute pressure sensor 40 like those disclosed herein coupled over a controller die 42. The MEMS absolute pressure sensor 40 may be both mechanically and electrically coupled to the controller die 42. In various implementations, and as illustrated by FIGS. 5-6, the MEMS absolute pressure sensor 40 may be a flip chip MEMS sensor. In this manner the MEMS absolute pressure sensor 40 may measure the pressure of a fluid directly below the pressure sensor. In such implementations, the MEMS absolute pressure sensor 40 may be coupled to the controller die through flip-chip coupling using solderable under-bump metallization (UBM) and/or solder bumps. For example, in FIG. 5 the controller die 42 includes bumps 44 and UBM portions 46 of the MEMS sensor that are placed over the bumps during reflow. This may be done at the wafer level and electrical testing may be done prior to singulation and shipping or transport of the device. Singulation, as relating to the various implementations disclosed herein, may occur using, by non-limiting example, a saw, a laser, a waterjet, plasma etching, deep reactive-ion etching, chemical etching, or any combination thereof.

In various implementations, a perimeter of the controller die 42 is not coextensive with a perimeter of the MEMS absolute pressure sensor 40. Specifically, in various implementations, the perimeter of the face of the controller die 42 facing the MEMS absolute pressure sensor 40 may be larger than the perimeter of the face of the MEMS absolute pressure sensor 40 facing the controller die 42. In other implementations, the perimeter of the face of the controller die 42 facing the MEMS absolute pressure sensor 40 may be substantially the same size as the perimeter of the face of the MEMS absolute pressure sensor 40 facing the controller die 42. In various implementations, the controller dies disclosed herein may be 2 mm×2 mm or 3 mm×3 mm. In other implementations, the controller dies disclosed herein may be larger than 4 mm² or smaller than 9 mm². The absolute pressure sensor device 38 of FIGS. 5 and 6 has a smaller footprint compared to conventional pressure sensor devices because the MEMS absolute pressure sensor is stacked over the controller die.

As illustrated in FIG. 5, the pressure sensor device 38 may include one or more support structures 48 under the solder interconnects to isolate stresses from the MEMS sensor structure, and these may be formed from the silicon of the controller die, or other silicon, glass, quartz, or another substrate or material bonded to the MEMS absolute pressure sensor 40 and/or formed in/on the controller die 42. Underfill materials, such as epoxies and other polymeric materials, could also be added under the MEMS absolute pressure sensor 40 to further isolate stresses.

The controller die 42 is configured to electrically couple with a module 50 through an electrical connector 52. In various implementations, the module 50, and other modules disclosed herein, may include a substrate, a motherboard or printed circuit board (PCB), or some other element allowing the MEMS sensor/controller die to communicate with other elements and/or to be powered. As illustrated by FIGS. 5 and 6, the electrical connector 52 is a wirebond. In other implementations, the controller die may be configured to electrically couple with a module through another type of electrical connector which may be, by non-limiting example, a stud, a bump, a ball grid array (BGA), a clip, or a through-silicon-via (TSV) within the controller die.

In various implementations, after the MEMS sensor is coupled with the controller die, it is tested in wafer form. In various implementations, this may be done before the controller die is electrically coupled with the module 50. This testing capability allows shipment of non-wire bonded units, or a controller dies 42 not electrically coupled to the modules 50, which may reduce failure mechanisms due to broken/cracked wirebonds or other electrical connections which have been damaged during shipment. The customer, or the user of the absolute pressure sensor device, may mount the combined MEMS absolute pressure sensor 40 and controller die 42 to a module 50 using epoxy or some other coupling mechanism. In various implementations, the controller die 42 may be increased in size, if needed, so that the MEMS absolute pressure sensor 40 has a smaller relative footprint. This can aid in protecting the MEMS absolute pressure sensor during the saw or singulation process of the individual devices. Sawing or singulation of the devices may be done while the MEMS absolute pressure sensors are attached to the controller die but before wirebonds or other electrical connections are in place.

In various implementations, the structure of FIGS. 5-6 may be used to form a wafer-level chip-scale package (WLCSP). The MEMS absolute pressure sensors may be received from a supplier in wafer form, singulated, mounted to controller die that are known good devices (KGDs), the combined structures may be tested in wafer form, and the combined structures may be singulated (such as through sawing) and picked and placed into a container such as a waffle pack for shipment to customers or other users. In this way, the overall yield of a process of manufacturing the combined sensors and controllers may be increased as the process allows for separate testing of the devices before they are mounted to each other.

Figure 7:
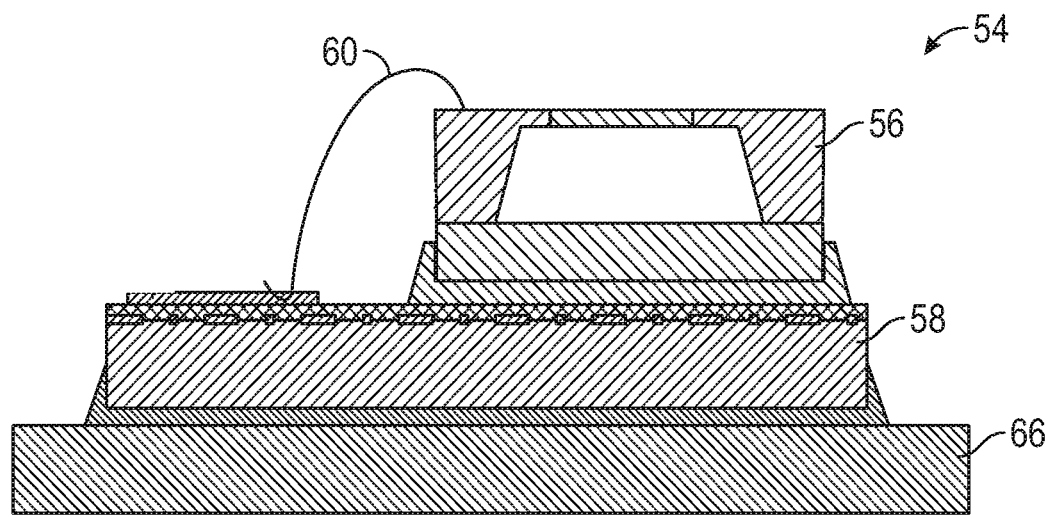
FIG. 7 is a cross sectional side view of a MEMS absolute pressure sensor wirebonded to a controller die.
Figure 8:
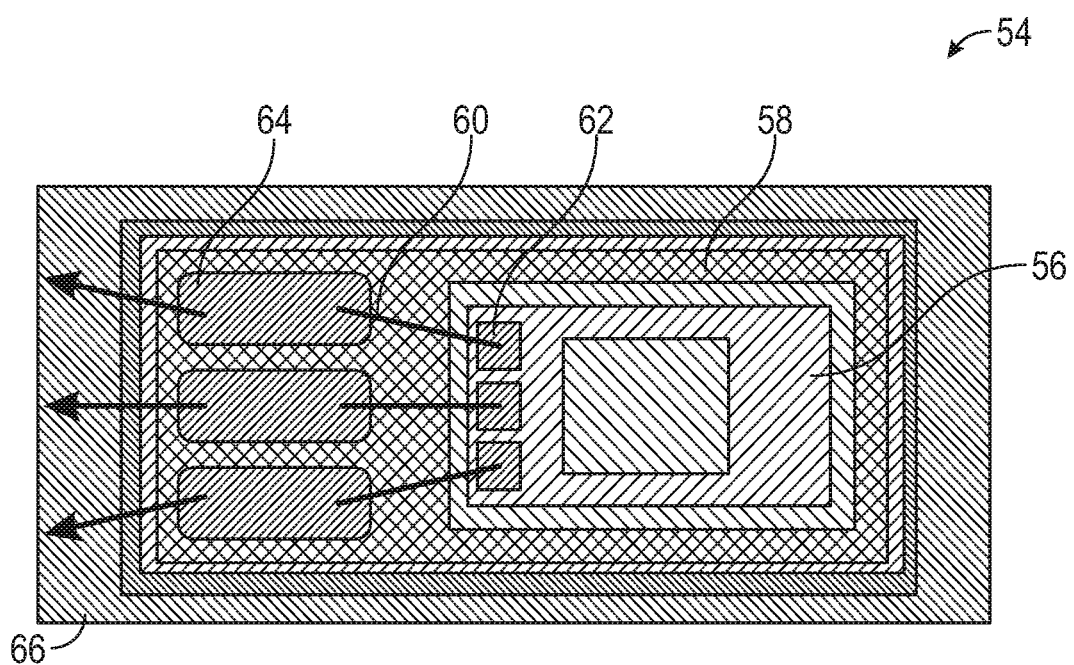
FIG. 8 is a top view of the device of FIG. 7.

Referring to FIGS. 7-8, a cross sectional side view and a top view of a MEMS absolute pressure sensor wire bonded to a controller die is illustrated. In many ways the absolute pressure sensor device 54 is similar to the absolute pressure sensor device 38 of FIG. 5, however, the MEMS absolute pressure sensor 56 is not flip-chip coupled to the controller die 58. In various implementations, the MEMS absolute pressure sensor 56 is electrically coupled with the controller die through a wirebond 60 or a clip. The wirebonds and the clips of the various implementations disclosed herein may be gold, copper, or any other metal or combination thereof. In other implementations, the MEMS absolute pressure sensor 56 is only configured to electrically couple with the controller die 58. Because the electrical contacts 62 at the top of the MEMS absolute pressure sensor and the electrical contacts 64 on the controller die 58 are at different levels, the electrical testing and/or calibration may be done using a dual-level method so as to still allow pre-testing and shipment without wirebonds in place. After shipment and/or testing, a customer or other user may wirebond the MEMS absolute pressure sensor 56 to the controller die 58 and mount the controller die 58 with a module 66 (such as with epoxy, die attach material, or the like) in any order. In various implementations, the MEMS absolute pressure sensor 56 and controller die 58 may have the same sizes as described above for the absolute pressure sensor device described in FIGS. 5 and 6 above. In other implementations, the controller die 58 footprint may be increased so that it is larger than the footprint of the MEMS absolute pressure sensor device as in previously described implementations. In various implementations, a singulation process may be done after the MEMS absolute pressure sensors are mounted to the controller die but before wirebonds or other electrical couplers are in place. Although wirebonds are shown in FIG. 7, in other implementations TSVs or any other electrical coupler previously disclosed herein could be used to couple the controller die 58 with the module 66.

Still referring to FIGS. 7 and 8, in other implementations, the wirebond 60 (or other electrical connection) from the MEMS absolute pressure sensor 56 to the controller die 58 is formed before shipment of the absolute pressure sensor device 54. In various implementations, electrical testing could be done after the MEMS absolute pressure sensor 56 is mounted but before the wirebond 60 is formed (using the aforementioned dual-level test) or testing could be done after the wirebond 60 has been formed so that dual-level testing is not required. If testing is done after the wirebond 60 is formed, then care can be taken to ensure that the wirebond is not damaged during testing. Singulation may be done after the MEMS absolute pressure sensor 56 is in place and after the wirebond 60 between the MEMS absolute pressure sensor 56 and controller die 58 has been formed. Care can be taken to ensure that the singulation and shipping do not damage the wirebond 60 between the MEMS absolute pressure sensor 56 and the controller die 58. In some implementations, a reverse wirebond could be used to minimize loop height.

Figure 9:
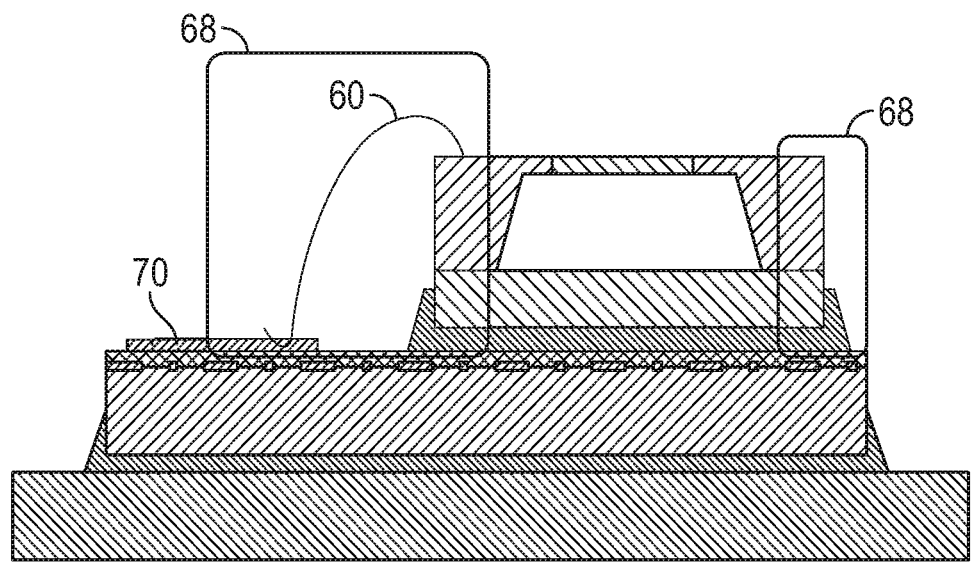
FIG. 9 is a cross sectional side view of the MEMS absolute pressure sensor of FIG. 7 partially encapsulated in an encapsulant coupled to a controller die.
Figure 10:
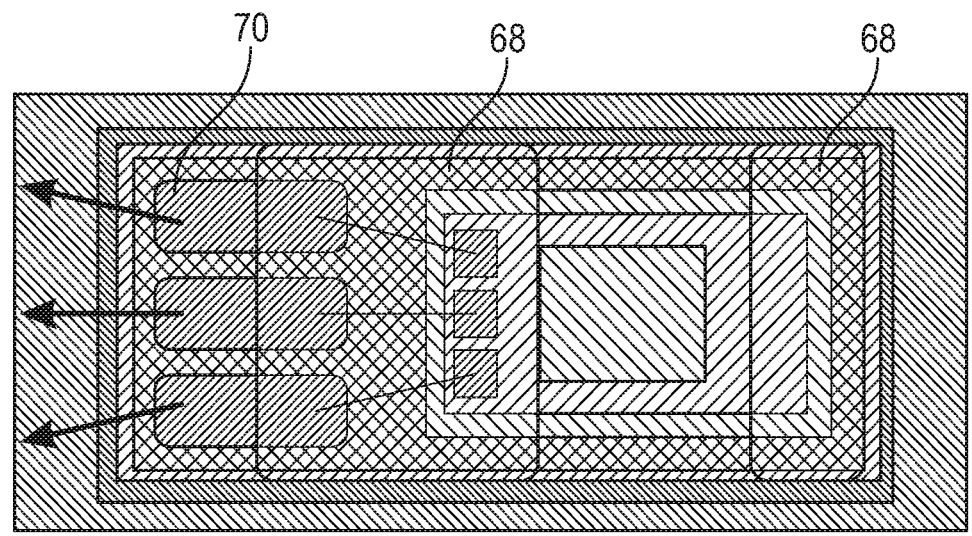
FIG. 10 is a top view of the device of FIG. 9.

Referring to FIGS. 9-10, a cross sectional see through side view and a top see through view of the MEMS absolute pressure sensor of FIG. 7 partially encapsulated in an encapsulant coupled to a controller die is illustrated. In various implementations, the MEMS absolute pressure sensor device includes an encapsulant 68 at least partially encapsulating the MEMS absolute pressure sensor 56 and the controller die 58. As illustrated in FIGS. 9-10, the encapsulant 68 may encapsulate the wirebonds 60 to reduce the risk of damage to or harm of the wirebonds during shipping or other use. In various implementations, the encapsulant 68 may only cover the wirebond portion. In other implementations, the encapsulant 68 may cover two or more sides of the MEMS absolute pressure sensor. In a particular implementation, all four sides of the MEMS absolute pressure sensor are encapsulated by the encapsulant 68, leaving just the actual MEMS sensor exposed. In various implementations, the majority of the exposed portion of the controller die may also be covered by the encapsulant 68 with just a portion of the contact pads 70 exposed to allow for a wirebond to be made between the contact pads 70 and the module 66. The shape of the encapsulant 60 is shown as being a rounded rectangular cuboid only for purposes of ease of illustration and any shape of encapsulant could be created in various implementations. In various implementations the encapsulant 60 is a liquid encapsulant, and liquid encapsulants could include, by non-limiting example, a glop top package encapsulant or encapsulants sold under the trade name HYSOL FP4450 and/or HYSOL FP4451 by Henkel Corporation of Rocky Hill, Conn. In implementations HYSOL FP4551, being more viscous, may be used to create a dam, and then HYSOL FP4450, being less viscous, may be used to fill in the dam and encapsulate the materials (flowing between wirebonds, interconnects, around corners, etc.). While FIGS. 9-10 show the encapsulant 68 applied to the device of FIG. 7, it is understood that an encapsulant similar to the encapsulant of FIGS. 9-10 could be applied to any of the MEMS absolute pressure sensor devices disclosed herein for the purpose of protecting various portions of the devices, such as, by non-limiting example, the MEMS absolute pressure sensor, the controller die, or any electrical connections.

In various implementations, the controller die 58 may be mounted to the module 66 by an end user other than the manufacturer of the device, such as with epoxy, die attach material, solder, and any combination thereof, and may then wirebond the controller die with the module (though TSV couplings could be used instead, as with other implementations). This process may give the end user more flexibility in manufacturing/installing the device.

Figure 11:
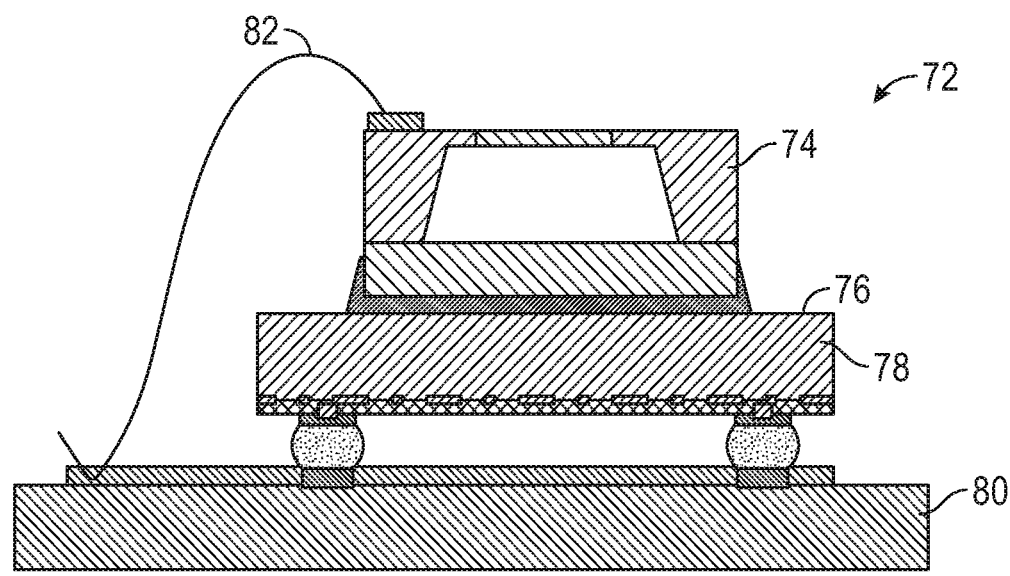
FIG. 11 is a cross sectional side view of a MEMS absolute pressure sensor coupled over a flip chip controller die.
Figure 12:
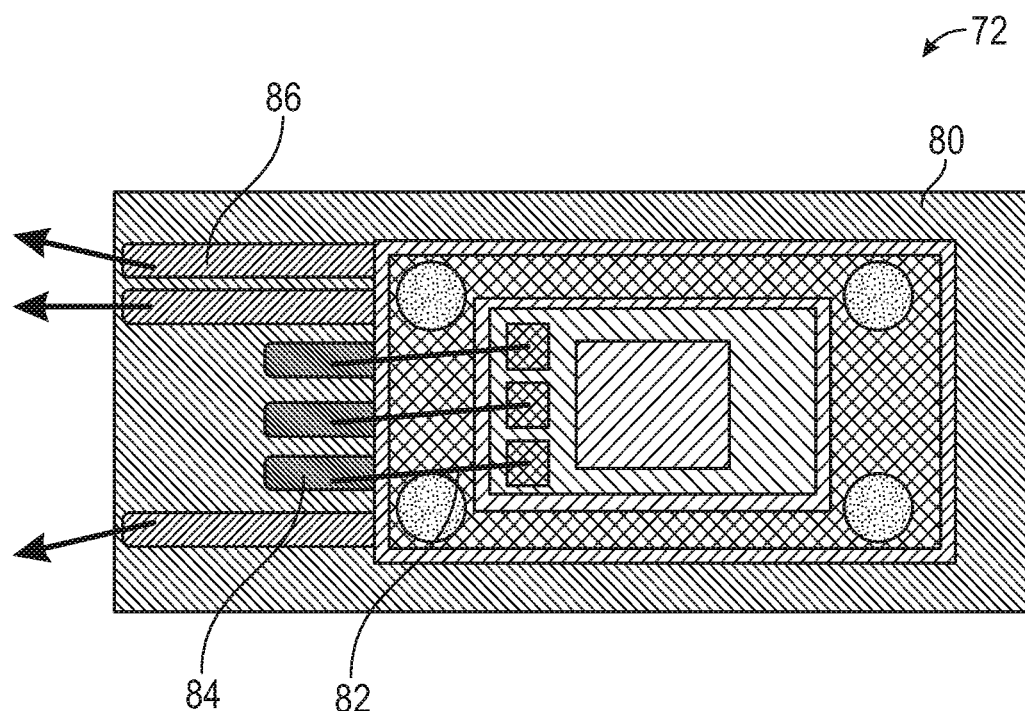
FIG. 12 is a top view of the device of FIG. 11.

Referring to FIGS. 11-12, a cross sectional side view and a top view of a MEMS absolute pressure sensor coupled over a flip chip controller die is illustrated. In various implementations, an absolute pressure sensor device 72 may include a MEMS absolute pressure sensor 74 coupled to a backside 76 of a controller die 78. In various implementations, and as illustrated by FIGS. 11-12, the controller die 78 may be a flip chip controller die. In such implementations, the controller die 78 may be configured to couple to a module 80 through flip-chip coupling using solderable under-bump metallization (UBM) and/or solder bumps. The bumps may be configured to couple to contacts 86 which are directly coupled over the module. However, in other implementations, studs may be used in various implementations.

In various implementations, such as the implementation illustrated by FIGS. 11-12, the MEMS absolute pressure sensor 74 may be configured to couple with the module 80 through a wirebond(s) 82. In such an implementation, the wirebond 82 may be coupled to an interconnect 84 on top of the module. The interconnect 84 may electrically couple the MEMS absolute pressure sensor 74 to the controller die 78. In other implementations the MEMS absolute pressure sensor 74 could couple with the controller die 78 using one or more TSVs or clips so that wirebonds are excluded altogether (this may also be done with other implementations described previously and hereafter). In such an implementation, the MEMS absolute pressure sensor 74 may be inverted. In various implementations, underfill materials, such as epoxies and other polymeric materials, could be added under the controller die 78. In various implementations, an encapsulant as previously described herein may encapsulate any portion of the device of FIGS. 11-12, including the one or more sides of the controller die. In various implementations, no portion of the controller die may be exposed.

The version illustrated by FIGS. 11-12 offers a small footprint (in some implementations the smallest of all versions described herein) and in various implementations, may avoid the shipment of wire bonded units. In various implementations, singulation (using any method previously disclosed herein) may be performed after the MEMS absolute pressure sensor 74 and controller die 78 are coupled but before wire bonding. Any inspection or testing of the controller 78 die may be done before mounting the controller die 78 to the module 80 since the mounting may make it more difficult to inspect and/or test the controller die 78 thereafter. Testing may be done in a way so that both the topside of the controller and/or pressure sensor are tested as the electrical contacts, or bumps, of the controller die 78 are tested (dual-sided test).

Figure 13:
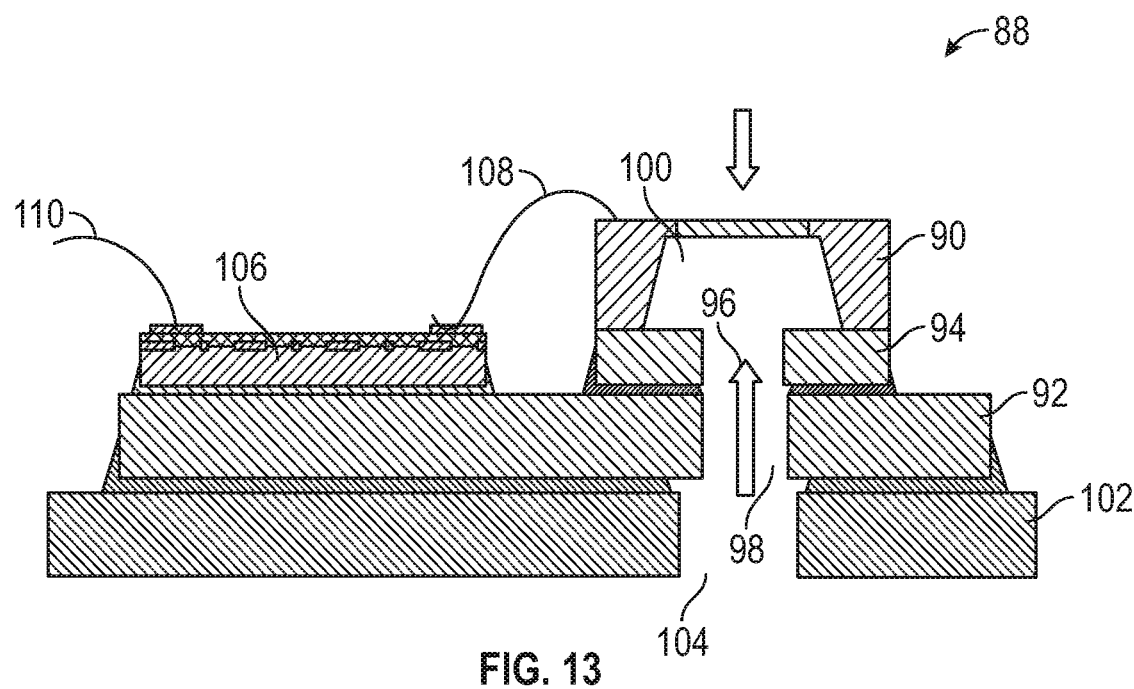
FIG. 13 is a cross sectional side view of a MEMS differential pressure sensor and controller die coupled over an interposer.
Figure 14:
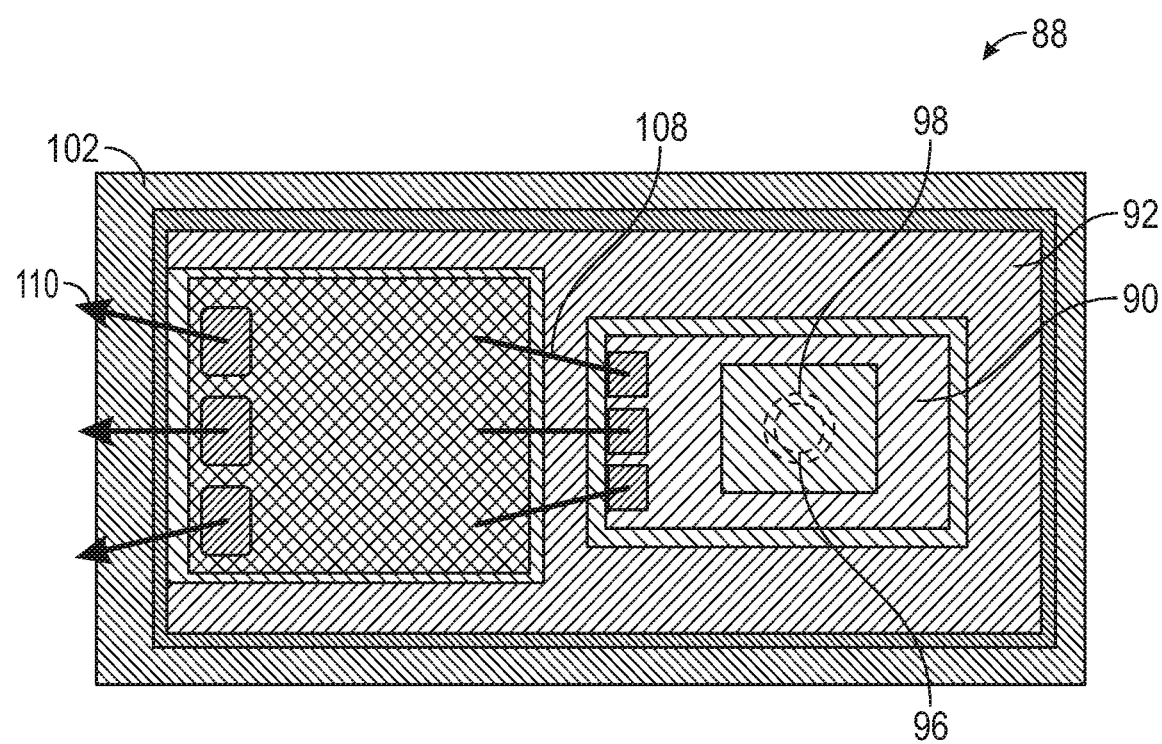
FIG. 14 is a top view of the device of FIG. 13.

Referring to FIGS. 13-14, a cross sectional side view and a top view of a MEMS differential pressure sensor and controller die coupled over an interposer is illustrated. In various implementations, the differential pressure sensor device 88 may include a MEMS differential pressure sensor 90 coupled over an interposer 92. The MEMS differential pressure sensor 90 may be directly coupled to the interposer 92. In various implementations, the MEMS differential pressure sensor may be flip-chip coupled to the interposer as further described in relation to FIG. 17 herein. As illustrated by FIG. 13, the MEMS differential pressure sensor 90 includes a carrier 94 with an opening 96 therethrough. The interposer 92 also includes an opening 98 which aligns with the opening 96 of the carrier 94. The interposer 92 may be configured to couple to a module 102 having an opening 104 therethrough. The opening 98 of the interposer 92 is configured to align with the opening 104 of the module 102. The opening 98 of the interposer 92 and the opening 96 of the carrier 94 provide fluid access to a cavity 100 of the MEMS differential pressure sensor 90. As used herein, a fluid may be, by non-limiting example, a gas, liquid, or other substance capable of flow. Because of the opening 98 in the interposer 92 and the opening 96 in the carrier 94, a differential pressure between the fluid (or lack thereof) below the differential pressure sensor device 88 and the fluid (or lack thereof) above the differential pressure sensor device 88 may be measured.

Referring to FIG. 13, the differential pressure sensor device 88 may include a controller die 106 coupled over the interposer 92. In various implementations, the controller die 106 may be directly coupled to the interposer 92. In various implementations, the controller die may be flip-chip coupled to the interposer as further described in relation to FIG. 17 herein. In various implementations the interposer may be silicon, while in other implementations the interposer 92 may be a ceramic material. Use of the interposer allows varying sized MEMS differential pressure sensors and varying sized controller dies to be used together, including implementations with a controller die that is smaller than the MEMS differential pressure sensor. While in various implementations, the interposer may add cost as it is an additional component to the differential pressure sensor device 88, the interposer 92 may allow for a quicker production of a MEMS differential pressure sensor 90 combined with a controller die 106 as standard fabrication processing techniques may be used for various sizes of MEMS differential pressure sensors and controller dies. Further, while the assembly of FIG. 13 may have a larger footprint, because the die are not stacked, the assembly may also have a lower height. Both the MEMS differential pressure sensor 90 and the controller die 106 are seen to be oriented upwards, though they may be oriented in any direction when placed into service.

The MEMS differential pressure sensor 90 is configured to electrically couple to the controller die 106. In other implementations, the MEMS differential pressure sensor 90 may be electrically coupled to the controller die 106. In such implementations, the MEMS differential pressure sensor 90 may be coupled to the controller die 106 through a wirebond 108. In other implementations, rather than a wirebond 108, the MEMS differential pressure sensor 90 may be coupled to the controller die 106 using a clip or conductive traces within the interposer 92.

The controller die 106 is configured to electrically couple to a module 102. In various implementations, the controller die 106 may be configured to couple with the module 102 through a wirebond 110. In other implementations, the controller die 106 could electrically couple with the interposer 92 and/or the interposer could electrically couple with the customer module through one or more TSVs instead. In still other implementations, the controller die may be configured to couple with the module through either a clip, a stud, a bump, TSVs, or any combination thereof.

Testing of the device of FIGS. 13 and 14 may be done at the manufacturer facility at two levels (dual-level testing as previously described herein). Singulation, using any method previously disclosed herein, may be done with the MEMS differential pressure sensors in place but without wirebonds in place. The combined MEMS sensor/controller die/interposer may be shipped to a customer or other user without the wirebonds in place. The customer or other user may then form the wirebond between the MEMS differential pressure sensor 90 and the controller die 106 and between the controller die 106 and the module 102, and the interposer 92 may be mounted to the module 102 (being careful to align through-holes) such as using epoxy or the like. The wirebond 108 between the MEMS differential pressure sensor 90 and the controller die 106 is illustrated as being die-to-die, but in various implementations a wirebond pad could be located on the interposer so that a wirebond-to-interposer coupling is made between the MEMS differential pressure sensor and the interposer and between the controller die and the interposer to make the electrical coupling. The wirebonding by the customer or other user removes the risk of wirebond damage during testing, singulation, shipment, and customer assembly.

In other implementations, the wirebond 108 coupling between the MEMS differential pressure sensor 90 and the controller die 106 may be formed prior to shipment to a customer or other user. The wirebond 108 (as well as the MEMS differential pressure sensor) may thus be present during testing, calibration, singulation (using any method previously disclosed herein), shipping, and/or customer assembly, and so care may be taken to ensure that the wirebond 108 is not damaged during any of these steps. The testing may be done before or after placement of the wirebond. The customer or other user could thus receive the combined MEMS sensor/controller die/interposer, with the MEMS differential pressure sensor 90 wirebonded to the controller die 96, and the customer would mount the interposer to the module 102 (aligning the through-holes), such as through the use of an epoxy, etc., and wirebond the controller die 106 with the customer module 102 (in any order). In other implementations one or more TSVs/clips may be used for electrically coupling the MEMS differential pressure sensor 90 with the controller die 106 and/or interposer 92 and/or electrically coupling the controller die 106 with the interposer 92 and/or module 102 so that one or all of the wirebonds may be eliminated altogether.

Figure 15:
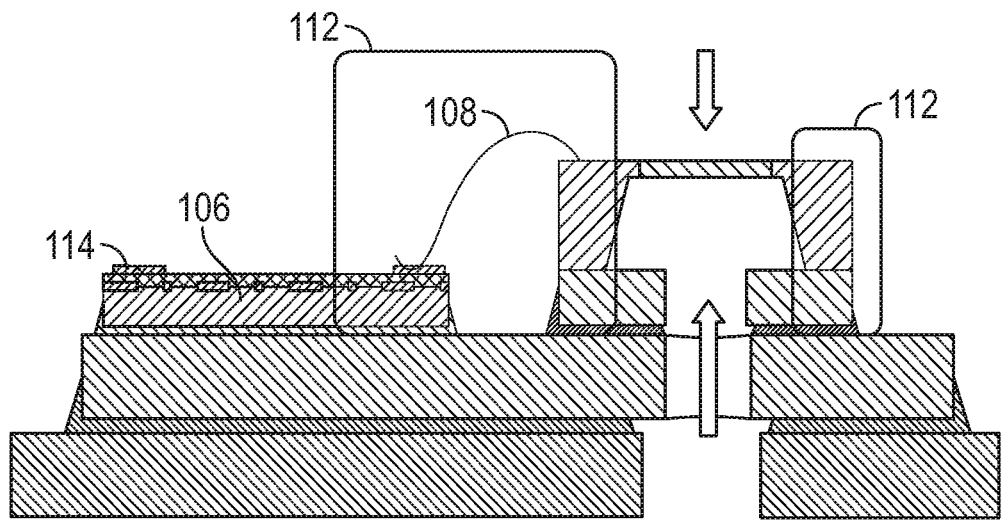
FIG. 15 is a cross sectional side view of the MEMS differential pressure sensor and the controller die of FIG. 13 partially encapsulated in an encapsulant coupled over an interposer.
Figure 16:
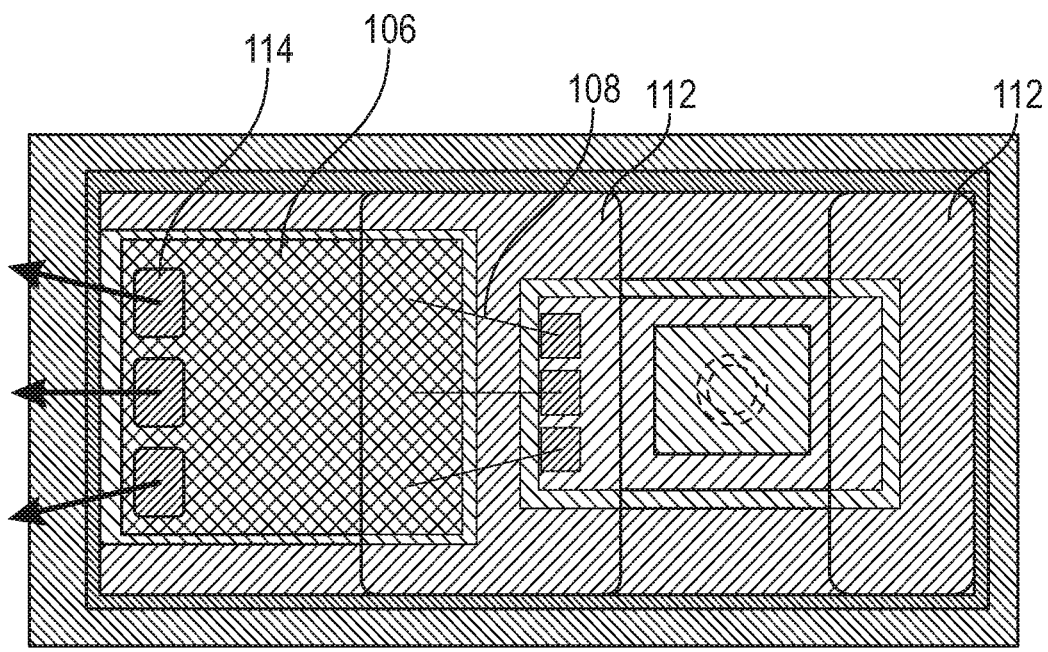
FIG. 16 is a top view of the device of FIG. 15.

Referring now to FIGS. 15-16, a cross sectional side view and a top view of the MEMS differential pressure sensor and the controller die of FIG. 13 partially encapsulated in an encapsulant coupled over an interposer is illustrated. In various implementations, the differential pressure sensor device includes an encapsulant 112 at least partially encapsulating the MEMS differential pressure sensor 90, the interposer 92, and the controller die 106. As illustrated in FIGS. 15-16, the encapsulant 112 may encapsulate the wirebonds 108 to reduce the risk of damage to or harm of the wirebonds 108 during shipping or other use. In various implementations, the liquid encapsulant 112 may only cover the wirebond portion. In other implementations, the encapsulant 112 may cover two or more sides of the MEMS differential pressure sensor. In a particular implementation, all four sides of the MEMS differential pressure sensor are encapsulated by the encapsulant 112, leaving just the actual MEMS pressure sensor exposed. In various implementations, the majority of the controller die 106 may also be covered by the encapsulant with the contact pads 114 exposed to allow for a wirebond to be made between the contact pad 114 and the module 102. The shape of the encapsulant 112 and the type of the encapsulant 112 may be any shape or type previously disclosed herein. While FIGS. 15-16 show the encapsulant 112 applied to the device of FIG. 13, it is understood that an encapsulant similar to the encapsulant of FIGS. 15-16 could be applied to any of the MEMS differential pressure sensor devices disclosed herein for the purpose of protecting various portions of the devices, such as, by non-limiting example, the MEMS differential pressure sensor, the controller die, the interposer, or any electrical connections.

Figure 17:
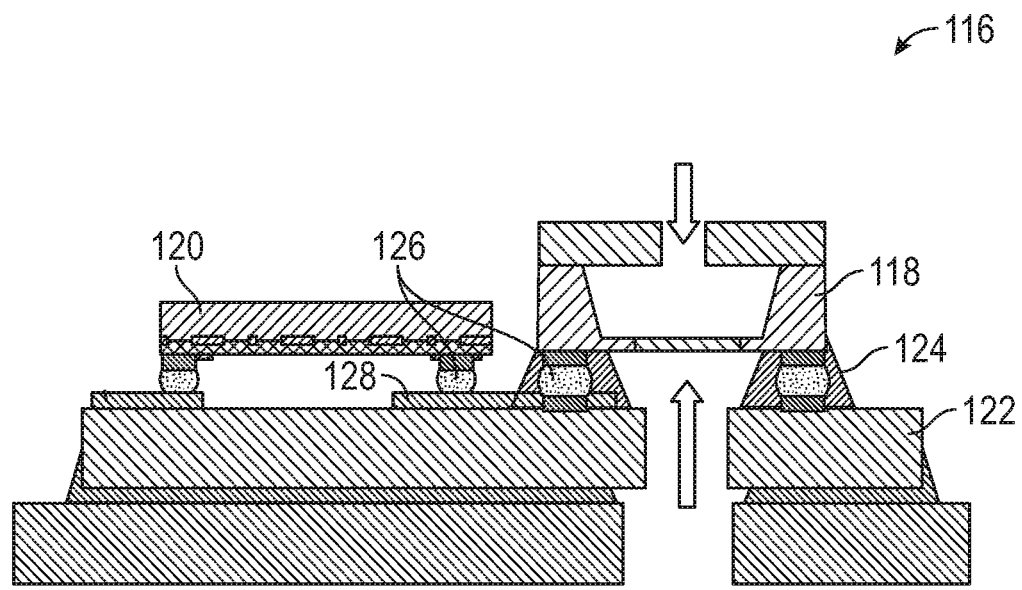
FIG. 17 is a cross sectional side view of a flip chip MEMS differential pressure sensor and a flip chip controller die coupled over an interposer.
Figure 18:
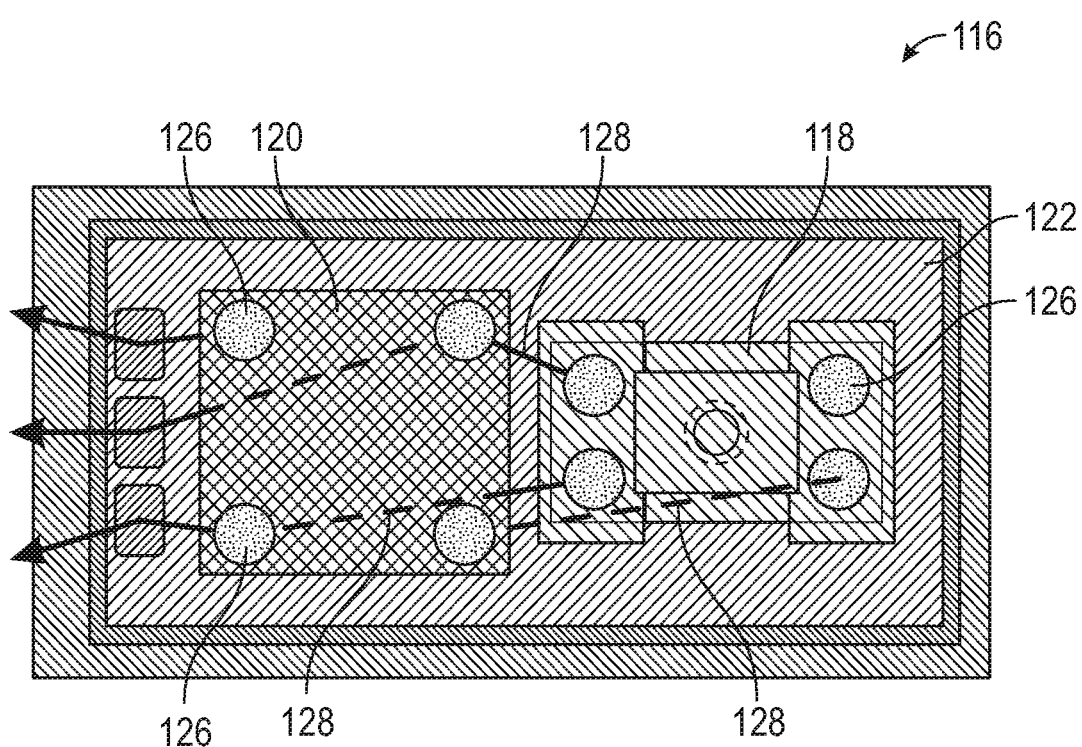
FIG. 18 is a top view of the device of FIG. 17.

Referring to FIGS. 17-18, a cross sectional side view and a top view of a flip chip MEMS differential pressure sensor and flip chip controller die coupled over an interposer is illustrated. The differential pressure sensor device 116 is similar to the differential pressure sensor device of FIGS. 13-14, with the primary difference being that the MEMS differential pressure sensor 118 is a flip chip pressure sensor and is coupled to the interposer 122 through a flip-chip coupling, and the controller die 120 is a flip chip controller die and is coupled to the interposer 122 through a flip-chip coupling. The flip-chip coupling may be through using solderable under-bump metallization (UBM) and/or solder bumps (or through studs) directly coupled to MEMS differential pressure sensor 118 and the controller die 120. In the implementation illustrated by FIG. 17, the MEMS differential pressure sensor 118 is electrically coupled to the controller die 120 through the bumps 126 of the flip chip coupling and through routing 128 on the interposer 122. An encapsulant or underfill 124, such as an epoxy or other polymer material, is used under the MEMS differential pressure sensor 118 (i.e., at the site of the MEMS sensor bumps) to ensure a substantially fluid-tight pressure seal between the MEMS differential pressure sensor and the interposer. In various implementations, underfill could also be placed under the controller die 120 at its interconnects. Care may be taken to ensure that the flip-chip bumps and the pressure seal of the MEMS differential pressure sensor do not affect the sensing or operation of the MEMS sensor. In various implementations, liquid encapsulants may be used to protect the device during testing, singulation, shipment, customer assembly, etc., while leaving areas such as wirebond pads, solder interconnect pads, solder joints, pressure gas vias, and other areas open for wirebonding and gas flow. This may provide additional strength, protection, and isolation.

In various implementations, only the MEMS differential pressure sensor is flip-chip coupled to the interposer, while the controller die is coupled to the interposer in the arrangement illustrated in FIG. 13. In other implementations, only the controller die is flip-chip coupled to the interposer while the MEMS differential pressure sensor is coupled to the interposer in the arrangement illustrated by FIG. 13.

Figure 19:
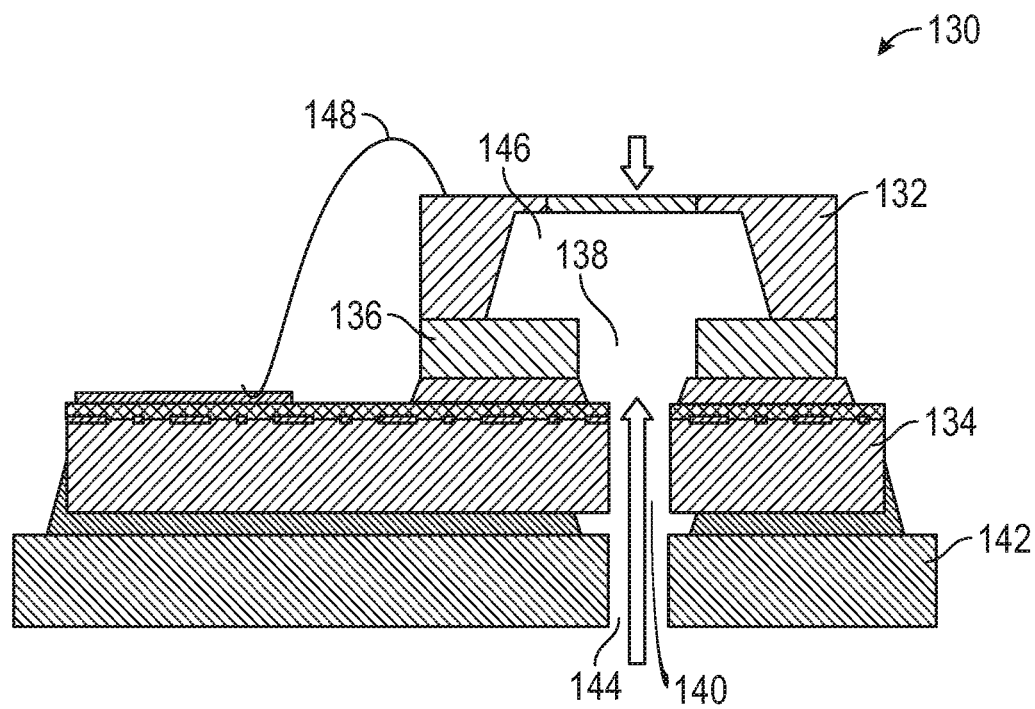
FIG. 19 is a cross sectional side view of a MEMS differential pressure sensor coupled over a controller die.
Figure 20:
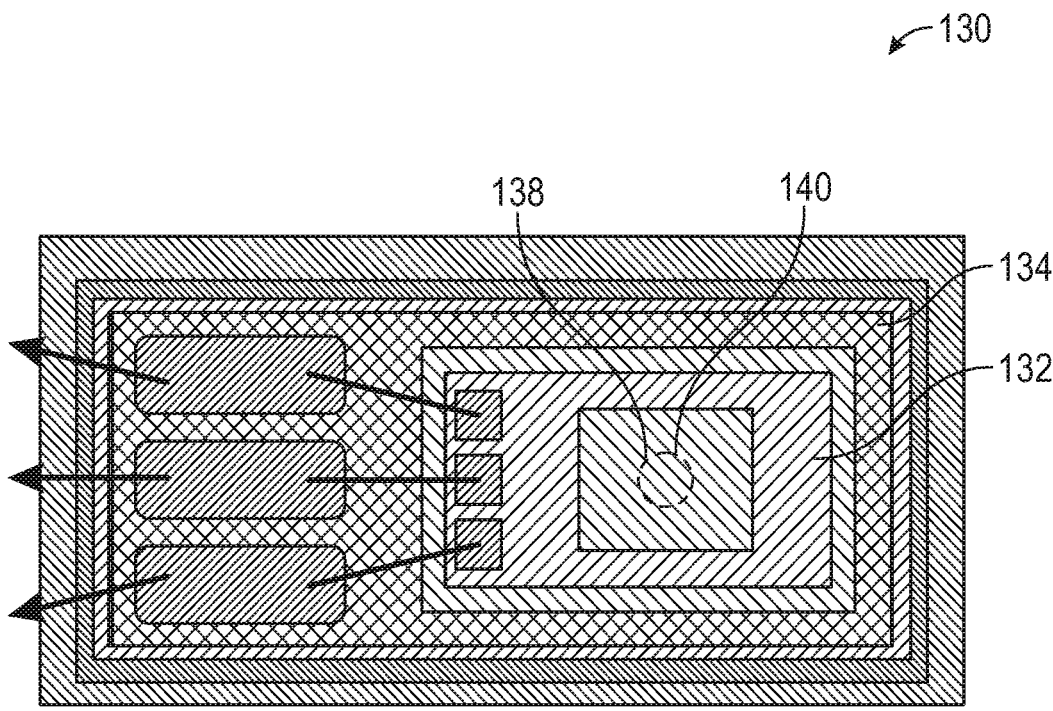
FIG. 20 is a top view of the device of FIG. 19.

Referring to FIGS. 19-20, a cross sectional side view and a top view of a MEMS differential pressure sensor coupled over a controller die is illustrated. In various implementations, the differential pressure sensor device 130 may include a MEMS differential pressure sensor 132 coupled over a controller die 134. The MEMS differential pressure sensor 132 may be directly coupled to the controller die 134. The MEMS differential pressure sensor 132 includes a carrier 136 with an opening 138 therethrough. The controller die 134 also includes an opening 140 which aligns with the opening 138 of the carrier 136. The opening 140 in the controller die 134 may be formed using post fabrication wet or plasma dry etching. The controller 134 may be configured to couple to a module 142 having an opening 144 therethrough. The opening 140 of the controller die 134 is configured to align with the opening 144 of the module 142. The opening 140 of the controller die 134 and the opening 138 of the carrier 136 provide fluid access to a cavity 146 of the MEMS differential pressure sensor 132. Because of the opening 140 in the controller die 134 and the opening 138 in the carrier 136, a differential pressure between fluid (or lack thereof) below the differential pressure sensor device 130 and fluid (or lack thereof) above the differential pressure sensor device 130 may be measured.

In various implementations, the MEMS differential pressure sensor 132 is electrically coupled with the controller die through a wirebond 148 or a clip. The wirebond or the clip may include gold, copper, or any other metal or combination of the foregoing. In other implementations, the MEMS differential pressure sensor 132 is configured to electrically couple with the controller die 134. In various implementations, electrical testing and/or calibration may be done using a dual-level method so as to still allow pre-testing and shipment without wirebonds in place. A customer or other user may then wirebond the MEMS differential pressure sensor 132 to the controller die 134 and mount the controller die 134 with a module 142 (such as with epoxy, die attach material, or the like) in any order.

In various implementations, the MEMS differential pressure sensor 132 and controller die 134 may have the same sizes as described above for the absolute pressure sensor device described in FIGS. 5 and 6 above. In other implementations, the controller die 134 footprint may be increased so that it is larger than the footprint of the absolute pressure sensor device as in previously described implementations. In various implementations, a singulation process, using any method previously disclosed herein, may be done after the MEMS absolute pressure sensors are mounted to the controller die but before wirebonds or other electrical couplers are in place. Although wirebonds are shown in FIG. 19 to couple the controller die 134 to the module 142, in other implementations the controller die 134 may be configured to couple with a module 142 using TSVs or any other electrical contact/connector previously disclosed herein.

Still referring to FIGS. 19 and 20, in other implementations, the wirebond 148 (or other electrical connection) from the MEMS absolute pressure sensor 132 to the controller die 134 is formed before shipment of the differential pressure sensor device 130. In various implementations, electrical testing could be done after the MEMS differential pressure sensor 132 is mounted but before the wirebond 148 is formed (using the aforementioned dual-level test) or testing could be done after the wirebond 148 has been formed so that dual-level testing is not required. If testing is done after the wirebond 148 is formed then care can be taken to ensure that the wirebond is not damaged during testing. Singulation, using any method previously disclosed herein, may be done after the MEMS differential pressure sensor 132 is in place and after the wirebond 148 between the MEMS differential pressure sensor 132 and controller die 134 has been formed. Care can be taken to ensure that the singulation and shipping do not damage the wirebond 148 between the MEMS differential pressure sensor 132 and the controller die 134. In some cases a reverse wirebond could be used to minimize loop height. As related to other devices disclosed herein, an encapsulant could similarly be used to protect the device 130 during testing, singulation, shipment, customer assembly, etc., while leaving areas open for wire bonding and gas/liquid flow.

Figure 21:
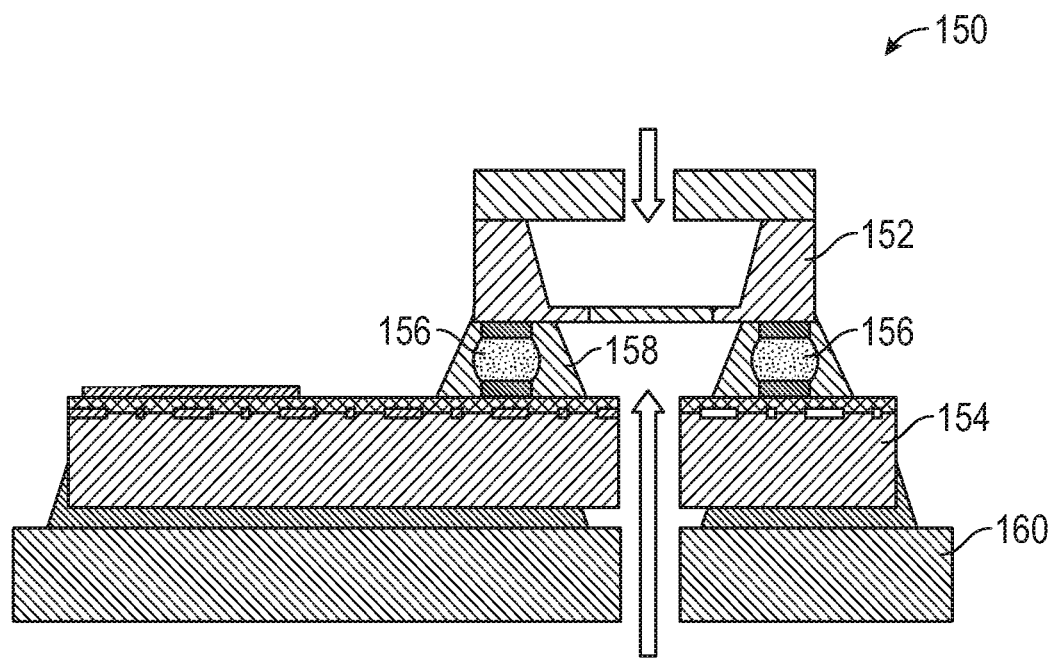
FIG. 21 is a cross-sectional side view of a flip chip MEMS differential pressure sensor coupled over a controller die.
Figure 22:
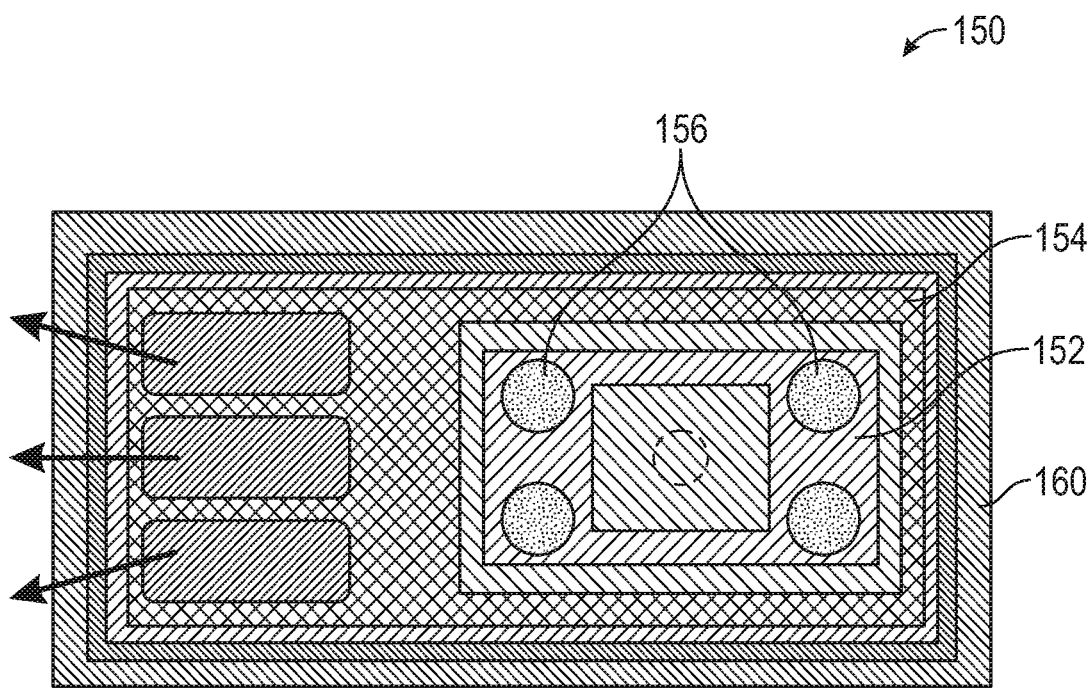
FIG. 22 is a top view of the device of FIG. 21.

Referring to FIGS. 21-22, a cross sectional side view and a top view of a flip chip MEMS differential pressure sensor coupled over a controller die is illustrated. The differential pressure sensor device 150 is similar to the differential pressure sensor device of FIGS. 19-20, with the primary difference being that the MEMS differential pressure sensor 152 is a flip chip pressure sensor and is coupled to the controller die 154 through a flip-chip coupling. The flip-chip coupling may be through using solderable under-bump metallization (UBM) and/or solder bumps (or studs) directly coupled to MEMS differential pressure sensor 152. In the implementation illustrated by FIG. 21, the MEMS differential pressure sensor 152 is electrically coupled to the controller die 154 through bumps 156. An encapsulant or underfill 158, such as an epoxy or other polymer material, is used under the MEMS differential pressure sensor 152 (i.e., at the site of the MEMS sensor bumps) to ensure a substantially fluid-tight pressure seal between the MEMS differential pressure sensor 152 and the controller die 154. Care may be taken to ensure that the flip-chip bumps and the pressure seal of the MEMS differential pressure sensor do not affect the sensing or operation of the MEMS sensor. In various implementations, an encapsulant similar to the encapsulants previously disclosed herein may be used to protect the device during testing, singulation, shipment, customer assembly, etc., while leaving areas such as wirebond pads, solder interconnect pads, solder joints, pressure gas vias, and other areas open for wire bonding and gas flow. This may provide additional strength, protection, and isolation. The controller die 154 may be configured to couple with a module 160 the same way the controller die of FIG. 19 is configured to couple with the module of FIG. 19. In various implementations, the controller die 154 may include support structures similar to the support structures of FIG. 5.

Figure 23:
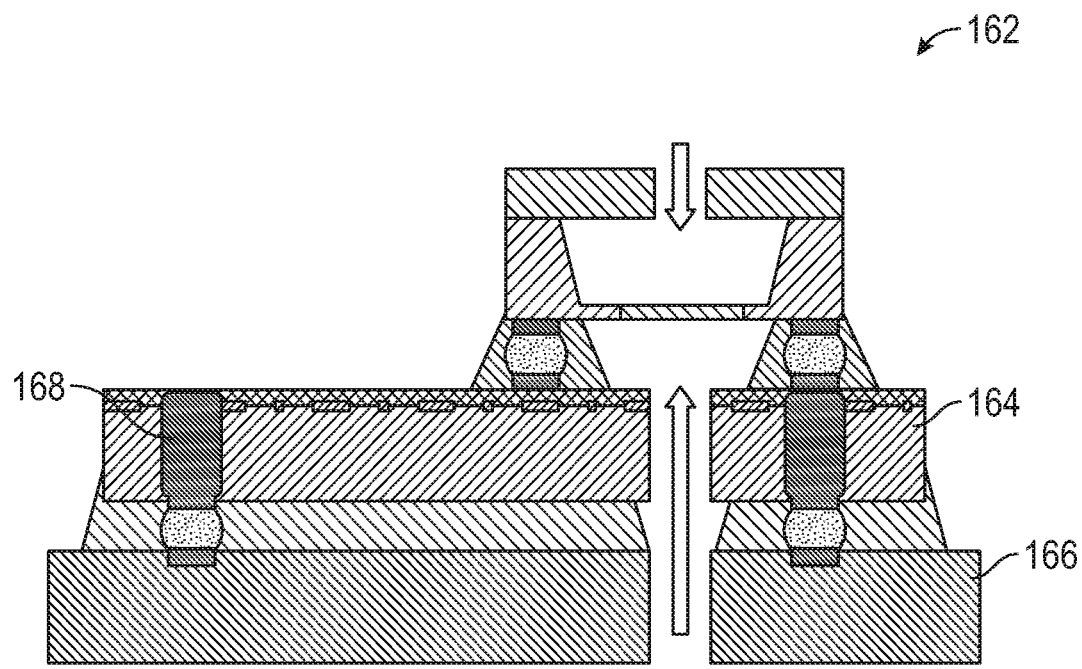
FIG. 23 is a cross-sectional side view of a flip chip MEMS differential pressure sensor coupled over a controller die having through-silicon-vias.
Figure 24:
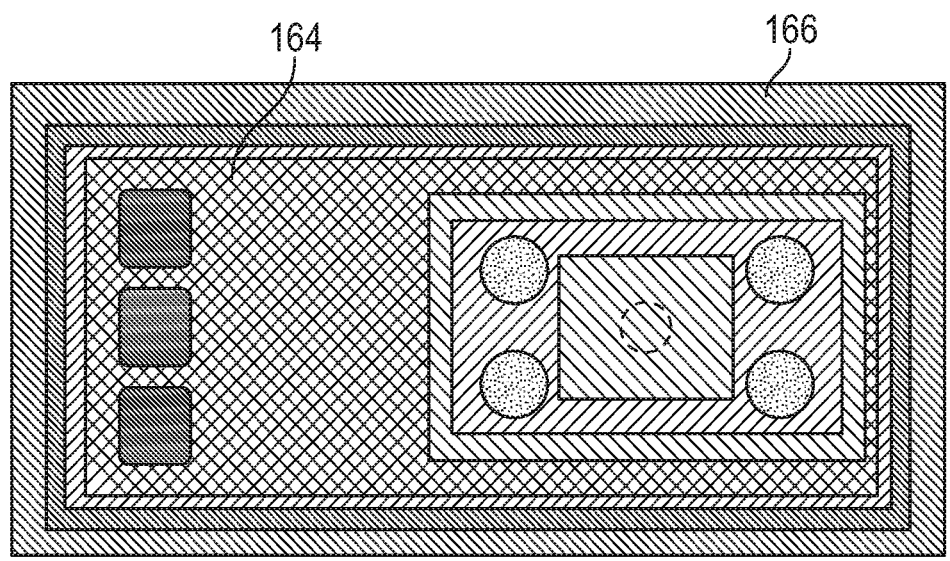
FIG. 24 is a top view of the device of FIG. 23.

Referring now to FIGS. 23-24, a cross sectional side view and a top view of a flip chip MEMS differential pressure sensor coupled over a controller die having TSVs is illustrated. The differential pressure sensor device 162 is similar to the differential pressure sensor device 150 of FIG. 21, with the difference being that the controller die 164 includes at least one TSV 168 therethrough. In this manner, the controller die 164 may be configured to couple to a module 166 through one or more TSVs 168 as illustrated in FIG. 23. By using TSVs, all wirebonds may be eliminated in the differential pressure sensor device 162.

Pressure sensor devices disclosed herein may include the ability to provide a combined driver (controller) die and MEMS device for a customer that has already been electrically tested, maximization of pressure sensor repeatability/predictability by minimizing stress variations to the MEMS device, minimization of overall footprint of the pressure sensor, minimization of the overall footprint of the driver (controller) die, minimization of the overall height of the pressure sensor, minimization of the overall height of the driver (controller) die, and/or increase of the overall yield.

Calibration of the pressure sensor devices disclosed herein, including controller die and associated pressure sensors, may be done over a desired operational temperature range. Devices and methods disclosed herein allow a level of calibration between a readout circuit and the MEMS pressure sensor prior to customer or other user assembly.

In places where the description above refers to particular implementations of pressure sensor devices and implementing components, sub-components, methods and sub-methods, it should be readily apparent that a number of modifications may be made without departing from the spirit thereof and that these implementations, implementing components, sub-components, methods and sub-methods may be applied to other pressure sensor devices.

What is claimed is:

1. A differential pressure sensor device comprising:
   a microelectromechanical system (MEMS) differential pressure sensor coupled over an interposer, wherein the interposer comprises an opening therethrough providing fluid access to the MEMS differential pressure sensor; and
   a controller die coupled over the interposer;
   wherein the MEMS differential pressure sensor is configured to electrically couple with the controller die; and
   wherein the controller die is configured to electrically couple with a module.

2. The device of claim 1, wherein the controller die is configured to couple with the module through one of a wirebond, a stud, a bump, and a through-silicon-via.

3. The device of claim 1, wherein the MEMS differential pressure sensor is electrically coupled with the controller die through a wirebond.

4. The device of claim 1, wherein the MEMS differential pressure sensor is coupled to the interposer through a flip-chip coupling, wherein an encapsulant at least partially encapsulates a plurality of flip-chip bumps and provides a substantially fluid-tight seal between the MEMS differential pressure sensor and the interposer.

5. The device of claim 1, wherein the controller die is coupled to the interposer through a flip-chip coupling.

6. The device of claim 1, further comprising an encapsulant at least partially encapsulating the MEMS differential pressure sensor, the controller die, and the interposer.

7. The device of claim 1, wherein the opening of the interposer is configured to align with an opening in the module.

8. A differential pressure sensor device comprising:
   a microelectromechanical system (MEMS) differential pressure sensor coupled over a controller die, wherein the controller die comprises an opening therethrough providing fluid access to the MEMS differential pressure sensor;
   wherein the MEMS differential pressure sensor is configured to electrically couple with the controller die; and
   wherein the controller die is configured to electrically couple with a module through an electrical contact.

9. The device of claim 8, wherein a perimeter of the controller die is not coextensive with a perimeter of the MEMS differential pressure sensor.

10. The device of claim 8, wherein the MEMS differential pressure sensor is coupled to the controller die through a flip-chip coupling, wherein an encapsulant at least partially encapsulates a plurality of flip-chip bumps and provides a substantially fluid-tight seal between the MEMS differential pressure sensor and the controller die.

11. The device of claim 8, wherein the MEMS differential pressure sensor is wirebonded to the controller die.

12. The device of claim 8, further comprising an encapsulant at least partially encapsulating the MEMS differential pressure sensor and the controller die.

13. The device of claim 8, wherein the controller die comprises one or more through-silicon-vias configured to electrically couple the controller die with the module.

* * * * *